United States Patent [19]
Loualiche et al.

[11] Patent Number: 5,511,088
[45] Date of Patent: Apr. 23, 1996

[54] PROCESS FOR FABRICATING STRIP OPTOELECTRONIC DEVICES, PARTICULARLY LASERS, AND DEVICES OBTAINED

[75] Inventors: Slimane Loualiche; Claude Vaudry; Loïc Henry, all of Lannion, France

[73] Assignee: France Telecom, Paris, France

[21] Appl. No.: 119,412

[22] Filed: Sep. 9, 1993

[30] Foreign Application Priority Data

Sep. 11, 1992 [FR] France ................................. 92 10848

[51] Int. Cl.⁶ ..................................................... H01S 3/19
[52] U.S. Cl. .................. 372/45; 372/46; 372/47
[58] Field of Search .................. 372/44, 45, 46, 372/47, 49, 43

[56] References Cited

U.S. PATENT DOCUMENTS

| | | | |
|---|---|---|---|
| 4,858,241 | 8/1989 | Suzuki et al. | 372/46 |
| 4,958,202 | 9/1989 | Kinoshita et al. | 372/46 X |
| 4,982,269 | 1/1991 | Calligaro | 437/203 |
| 5,151,914 | 9/1992 | Vidimari et al. | 372/46 |
| 5,164,329 | 11/1992 | Moyer | 437/126 |
| 5,253,265 | 10/1993 | Seko et al. | 372/46 |
| 5,283,209 | 2/1994 | Poingt et al. | 437/228 |

OTHER PUBLICATIONS

J. P. Van Der Zeil et al, "InGaAsP Strip Buried Heterostructure Lasers Grown By MOCVD," IEEE Journal Of Quantum Electronics vol. 27, No. 11, Nov. 1991, New York, pp. 2378–2385.

Patent Abstracts of Japan vol. 6, No. 140 (E–121), Jul. 29, 1982 & JP–A–57 063 883 (Mitsubishi Denki KK), Takimoto.
Patent Abstracts of Japan vol. 9, No. 50 (P–339), Mar. 5, 1985 & JP–A–59 189 305 (Nippon Denshin Denwa Kosha), Osamu.
Patent Abstracts of Japan vol. 3, No. 58 (E–111), May 18, 1979 & JP–A–54 036 179 (Tokyo Shibaura Denki KK), Shibagaki.
Patent Abstracts of Japan vol. 15, No. 246 (E–1081), Jun. 24, 1991 & JP–A–03 078 277 (Seiko Epson Corp), Yoshifumi.
Patent Abstracts of Japan vol. 13, No. 268 (E–775) Jun. 20, 1989 & JP–A–01 059 882 (Omron Tateisi Electronics Co), Akira.
Patent Abstracts of Japan vol. 9, No. 122 (P–359) May 28, 1985 & JP–A–60 008 820 (Hitachi Seisakusho KK), Kouji et al.

Primary Examiner—Rodney B. Bovernick
Assistant Examiner—Hemang Sanghavi
Attorney, Agent, or Firm—Blakely, Sokoloff, Taylor & Zafman

[57] ABSTRACT

The invention relates to a process for fabricating a semiconductor optoelectronic device comprising an active region in strip form. The process comprises the stages consisting in 1) producing various layers (120, 130, 140, 150, 160) making up the complete structure of the optoelectronic device by a single epitaxy; 2) etching the structure obtained in stage 1) down to the base of the active layer (130) of the optoelectronic device to isolate a strip in the said active layer; 3) depositing an electrically isolating material of controlled index (170) on the etched zone. The invention also relates to the devices obtained.

7 Claims, 8 Drawing Sheets

5,511,088

PROCESS FOR FABRICATING STRIP OPTOELECTRONIC DEVICES, PARTICULARLY LASERS, AND DEVICES OBTAINED

BACKGROUND OF THE INVENTION

1. Field of the Invention

The present invention relates to the field of semiconductor optoelectronic devices comprising an active region in strip form.

The present invention applies in particular, but not exclusively, to semiconductor lasers.

2. Background Information

The most popular laser structure in use today is formed from a double heterojunction.

As shown in attached FIGS. 1 and 2, semiconductor lasers formed from a double heterojunction generally comprise, on a semiconductor substrate 10, an active layer 14 produced from a low energy gap semiconductor material which amplifies reflected light by stimulated emission (recombination of electron/hole pairs resulting in an emission of light at an energy close to that of the material's energy gap), surrounded respectively on each side of its main faces 13, 15, by layers 12, 16 produced from higher energy gap semiconductor materials.

Semiconductor lasers are generally fabricated on GaAs or InP substrates 10. For lasers employed in telecommunications operating at wavelengths of 1300 nm and 1500 nm, substrate 10 is produced in InP. For lasers operating at wavelengths of 850 nm and above, up to 630 nm (for compact disk lasers for example), substrate 10 is produced in GaAs.

The interface between active layer 14 and subjacent layer 12 constitutes the p-n junction of the laser.

The two layers 12, 16 of higher energy gaps ensure the transverse confinement of the structure, i.e. perpendicularly to the junction formed between active layer 14 and the higher energy gap adjacent layer 12.

Active layer 14 is less than 1000 nm thick (typically 200 nm). Layers 12 and 16 which surround it are thicker, and are generally over 1000 nm thick (typically 1500 and 2000 nm).

Active zone 14 also has a higher refractive index than surrounding zones 12 and 16 For example, for a double heterostructure laser produced on an InP substrate 10 emitting at 1550 nm, the GaInAsP active zone 14 is 200 nm thick and has an index of 3.5, and the optical and electrical confinement layers 12 and 16, which are in InP, are approximately 1500 nm thick and have an index of 3.2.

The light emitted in active region 14 by the recombining of carriers, holes and electrons is guided by the low indexes of confinement layers 12 and 16. Preferably, a large overlap is sought between active gain zone 14 where the photons are emitted and guide layers 12 and 16.

Active region 14 is also confined both longitudinally and laterally.

Longitudinal confinement is obtained by cleaving the crystallographic structure making up active region 14 along faces 110 or 1–10 so as to form two reflectors.

The beam therefore generally propagates in direction 100 which corresponds to the largest dimension of active layer 14. This dimension ranges from 0.05 mm for short lasers to 1 mm for long lasers.

The width of active layer 14, defined by lateral confinement, is generally in the range 1000 to 2000 nm.

Different techniques has been proposed to ensure the lateral confinement of active layer 14, i.e. to define an active zone in strip form that is narrower than substrate 10.

Five known lateral confinement techniques are shown schematically in FIGS. 3 to 7.

According to the first known technique shown in FIG. 3, a rectangular strip is etched in the base substrate, the active zone then being epitaxed in this strip. This technique makes it possible to obtain a channeled substrate planar laser.

According to the second known technique shown in FIG. 4, an entire laser structure is produced in a single growth. Next, optical lateral confinement is provided by etching the entire structure to approximately 200 nm above the active zone around a strip. The strip is approximately 1000 nm to 3000 nm wide so as to provide a stable mode. An oxide layer is then deposited to electrically insulate everywhere except on the strip. The contact above the strip is used to supply current. The low index of the insulation close to the active zone (at 200 or 300 nm) above this zone prevents the optical mode from spreading laterally outside the strip. The advantage of this structure is that it can be produced without restarting epitaxy, and is known as the strip structure (ridge waveguide laser).

According to a third known technique shown in FIG. 5, a V-shape is etched into an epitaxed layer. A double heterostructure is then fabricated by restarting epitaxy using LPE (liquid phase epitaxy) above this V-shaped etch, respecting the rule that n zones are placed inside the V in front of the p zones located outside the V and vice versa in order to obtain good lateral electrical confinement. This is facilitated by the fact that when epitaxy is restatted, the layers are thicker at the center of the V than at the extremities. This gives these layers a crescent shape (hence the name buried crescent laser).

According to a fourth know technique shown in FIG. 6, the structure known as the DCPBH structure (Double Channel Planar Buried Heterostructure Laser) is obtained by etching two channels, one on each side of a strip which serves as an active zone. N and P zone epitaxy is restarted around the strip on the etched channels to ensure the laser's optical and electrical confinement. Epitaxy is restarted by LPE.

According to a fifth known technique shown in FIG. 7, double epitaxy is used to produce a structure known as a BRS structure (Buried Ridge Structure). The first epitaxy is used to grow a buffer layer and then the optical and electrical confinement zones surrounding the active zone. Next, a 1000 to 2000 nm strip is defined by etching the material around this strip and restarting epitaxy with a material of low index (the same as the confinement zones above and below the active zone).

Although the different known techniques described above have rendered great service, they are not, however, totally satisfactory.

Note, first, that the different index guided structures shown in FIGS. 5, 6 and 7 require epitaxy to be restarted which weighs down the technology and increases fabrication time.

Furthermore, the structures shown in FIGS. 3 and 4, which are made without restarting epitaxy, and whose optical guiding is achieved by gain, and therefore low, are not very stable in operation.

SUMMARY OF THE INVENTION

The object of the present invention is to propose a new semiconductor optoelectronic device structure comprising an active region in strip form, which does not require epitaxy to be restarted and which is also perfectly stable in operation.

This objective is reached according to the present invention thanks to a process for fabricating a semiconductor optoelectronic device comprising an active region in strip form, said process comprising the stages consisting in:

1) producing the various layers making up the complete structure of the optoelectronic device by a single epitaxy,
2) etching the structure obtained in stage 1) down to the base of the active layer of the optoelectronic device in order to isolate a strip in it, and
3) depositing an electrically insulating material of controlled index on the etched zone.

The present invention also relates to the semiconductor optoelectronic devices obtained by implementing the above-mentioned process.

The present invention applies notably to the fabrication of semiconductor lasers, as mentioned in the introductory section of this patent application.

BRIEF DESCRIPTION OF THE DRAWINGS

A full understanding of the other characteristics, objects and advantages of this invention can be gained from the following non-limiting, detailed description of a number of embodiments of the invention when read in conjunction with the attached drawings in which.

DESCRIPTION OF THE PREFERRED EMBDOIMENTS

Figure 1:
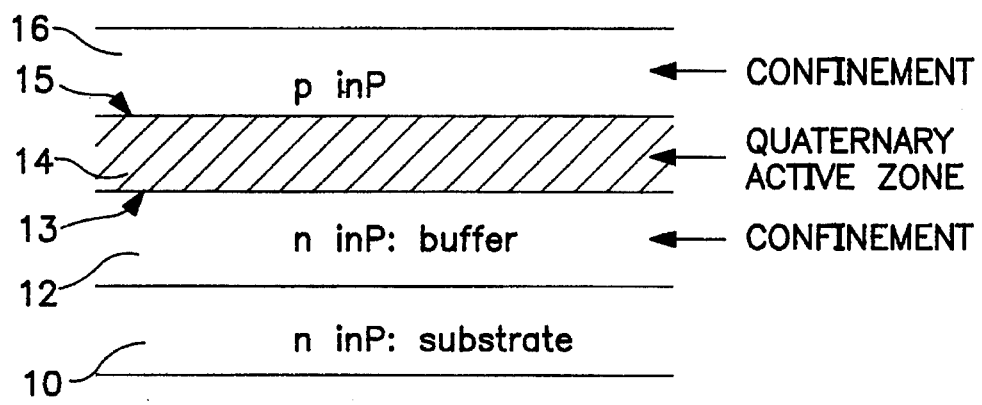
FIGS. 1 to 7, previously described, show the current state of the art.
Figure 2:
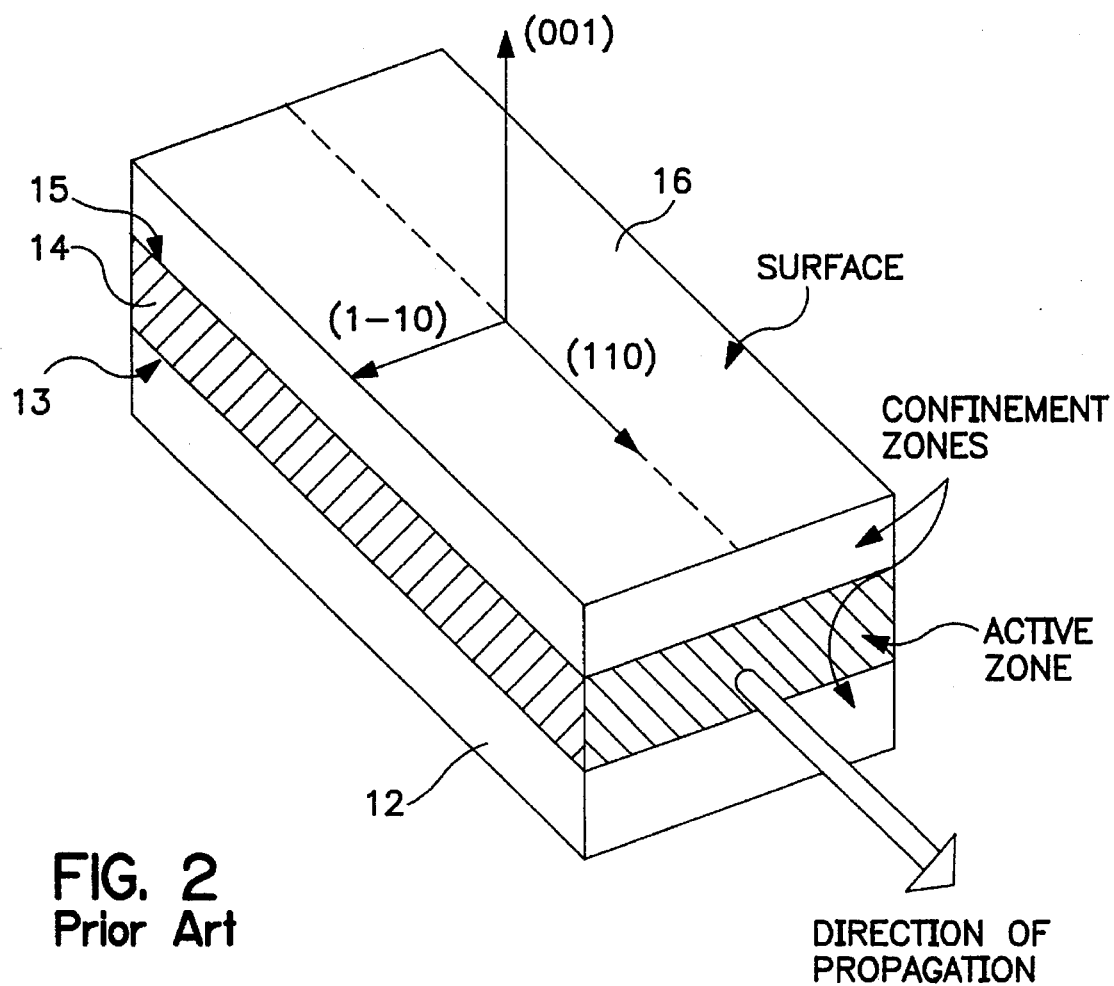
Figure 3:
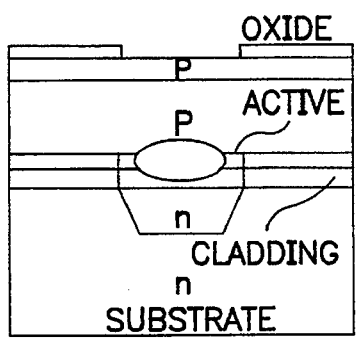
Figure 4:
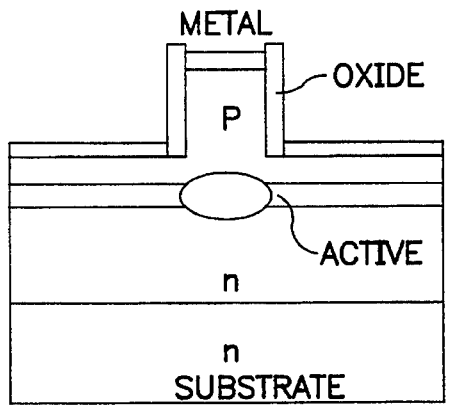
Figure 5:
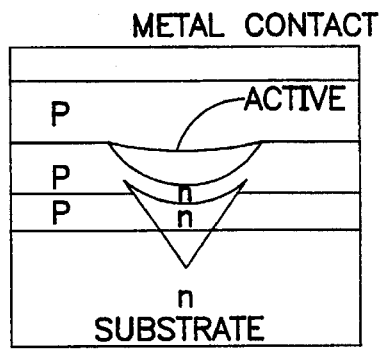
Figure 6:
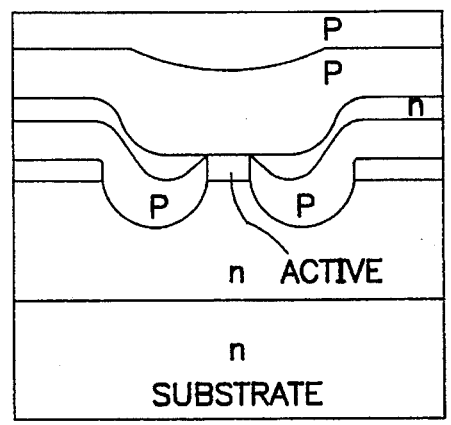
Figure 7:
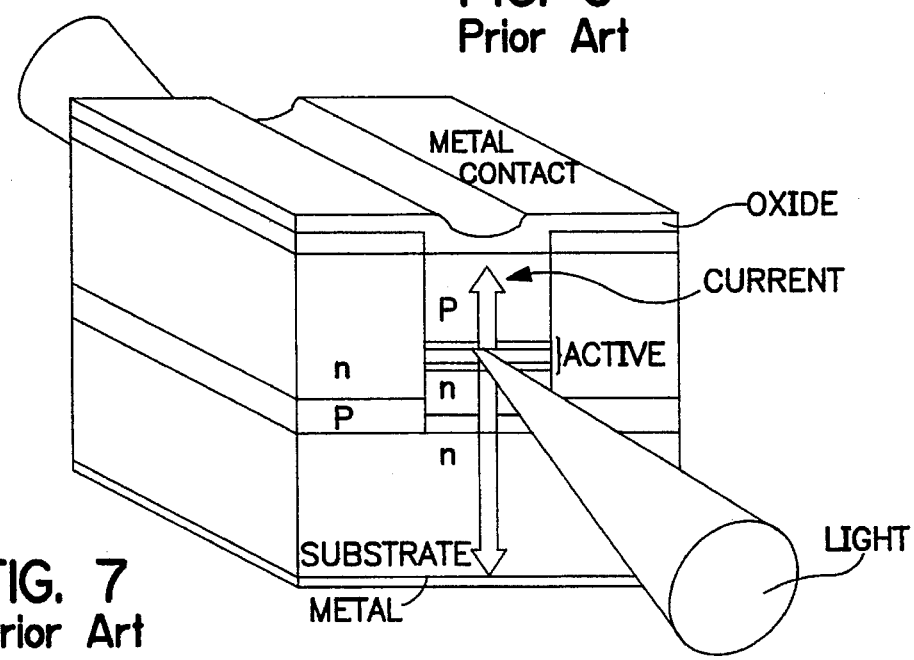
Figure 8:
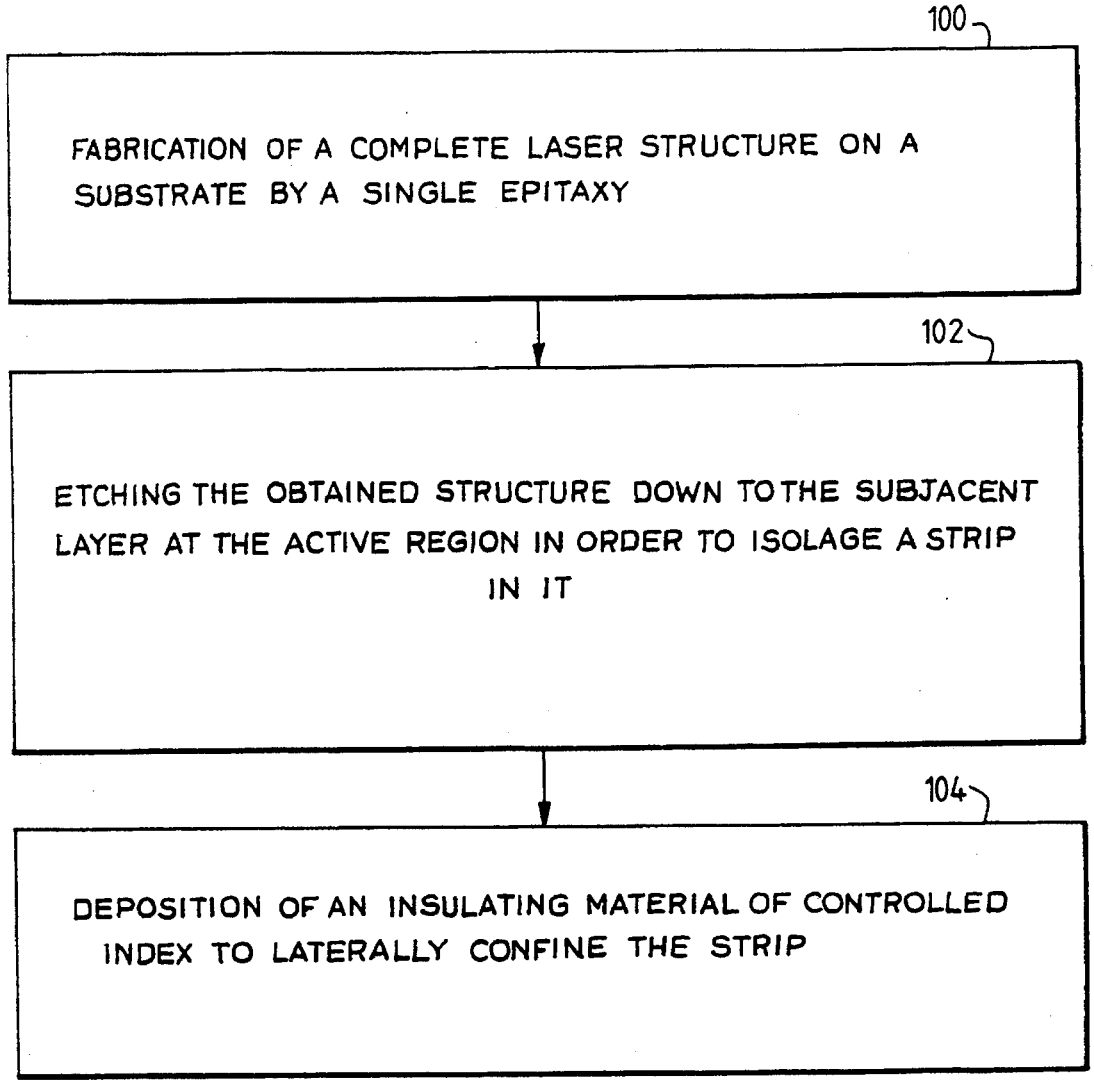
FIG. 8 shows a general flow chart of the process according to the invention.

As mentioned previously and as shown in FIG. 8, the process according to this invention for fabricating a semiconductor optoelectronic device comprising an active region in strip form essentially comprises the stages consisting in:

1) producing the various layers forming the complete structure of the optoelectronic device by means of a single epitaxy, as shown in stage 100 in FIG. 8,
2) etching the structure obtained in stage 1) above, down to the base of the active layer of the optoelectronic device in order to isolate a strip in it, as schematized in stage 102 in FIG. 8, and
3) depositing an electrically insulating material of controlled index on the etched zone, as schematized in stage 104 in FIG. 8.

Within the framework of an application for fabricating a laser, stage 1) consists more precisely in, preferably, producing a complete laser structure during a single epitaxy comprising a first confinement layer, an active zone, a second confinement layer, and at least one ohmic contact zone.

For the purposes of an example, one particular embodiment of the invention will now be described in greater detail with respect to FIGS. 10 to 15.

The electrically insulating material of controlled index can be deposited at stage 3) using any suitable technique known to those skilled in the art. This could be, without being a limitative enumeration, deposition by electron gun, or using a technique such as that known under the names CVD (Chemical Vapor Deposition) or MOCVD (Metal Organic Chemical Vapor Deposition).

The use of a confinement material of controlled index makes it possible to obtain good optical confinement. Moreover, the high electrical resistivity property of the insulating material deposited in stage 3) provides good electrical confinement.

The index of the electrically insulating material deposited in stage 3) can be constant across its thickness. As a variant, a material of variable index across its thickness could be employed to refine the optical confinement properties, the index of the material being made to change during the deposition phase in stage 3).

According to one advantageous embodiment of this invention, the dielectric material of controlled index deposited in stage 3) is silicon nitride.

The inventors selected this particular material following many tests.

Silicon nitride has many advantages within the framework of the implementation of the invention, from which the following may be mentioned:

perfect adaptation to the edges of the etched strip, without generation of defects on it, large range of change in the index since the index of the material can vary from 3.8 for amorphous silicon to 2.8 for silicon nitride $Si_3N_4$. Silicon nitride is therefore suitable for replacing III–IV semiconductor materials for which the index generally varies from 3 to 3.5 at a wavelength of 1550 nm.

the resistivity of silicon nitride is greater than $10^9 \Omega$ cm.

silicon nitride is one of the purest basic materials that can be found industrially.

silicon nitride is easy to evaporate.

silicon nitride is not expensive.

silicon nitride is not toxic.

The composition of silicon nitride, and therefore its index, can be easily controlled by nitrogen flow rate.

The working technology of silicon nitride, particularly deposition, etching, annealing, etc., is well known in microelectronics.

The inventors studied the index of silicon nitride deposited by electron guns as a function of nitrogen flow rate. The resulting curve measured is shown in attached FIG. 9.

Figure 9:
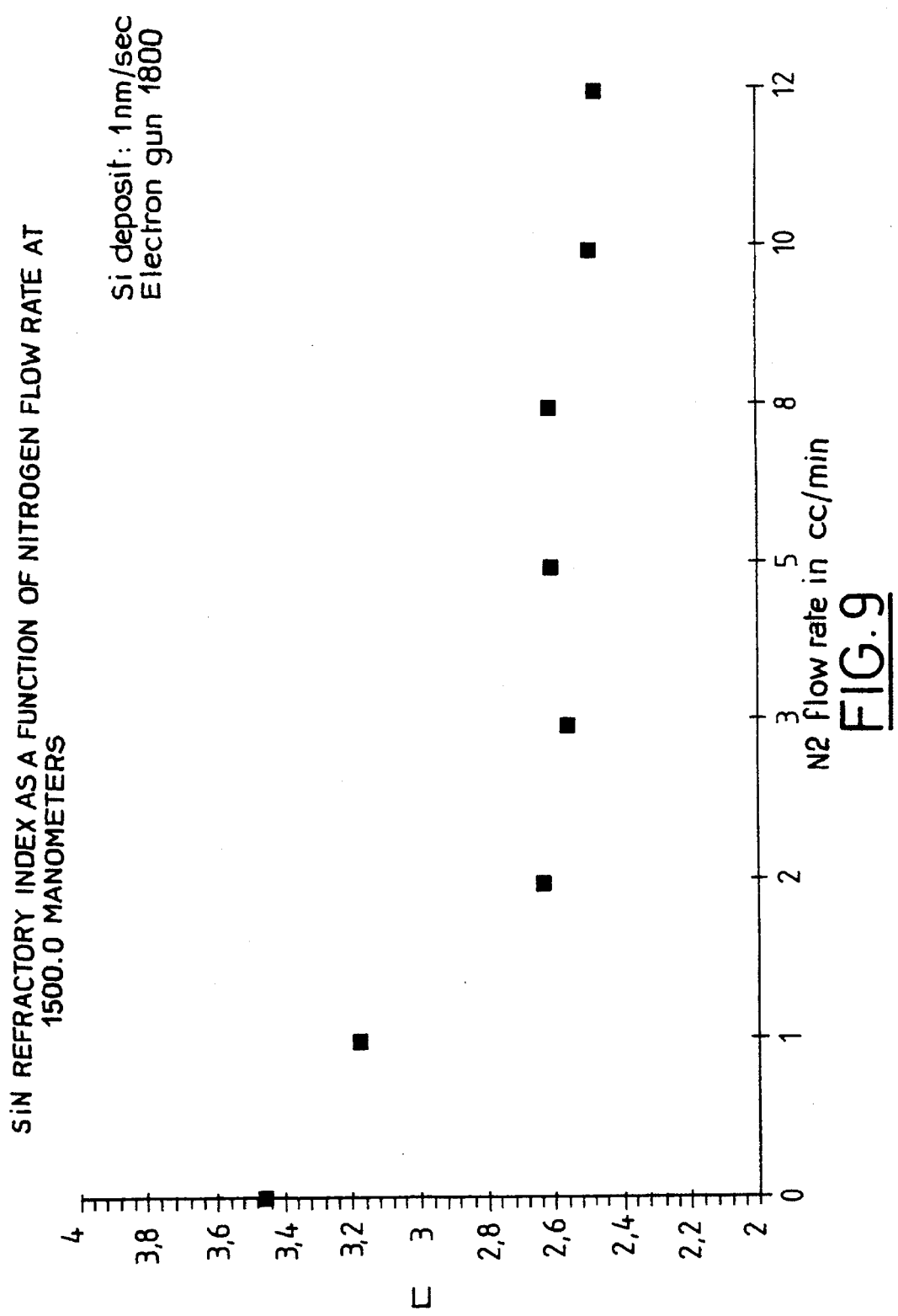
FIG. 9 shows the change in refractive index of silicon nitride as a function of nitrogen flow rate.

FIG. 9 shows that the index of the material deposited in stage 3) is easily controllable by nitrogen flow rate.

Clearly, the present invention is not solely limited to this particular embodiment and extends in a more general way to controlling the index of a electrically resistant material deposited at stage 3) by control of the surrounding atmosphere, without this being composed exclusively of nitrogen.

Fot the purposes of an example, one embodiment of the invention will now be described in greater detail with reference to FIGS. 10 to 15.

According to the embodiment shown in these figures, the inventors produced the various layers making up a complete double heterostructure based laser structure by means of a single epitaxy using gaseous source molecular beam epitaxy (GSMBE).

Figure 10:
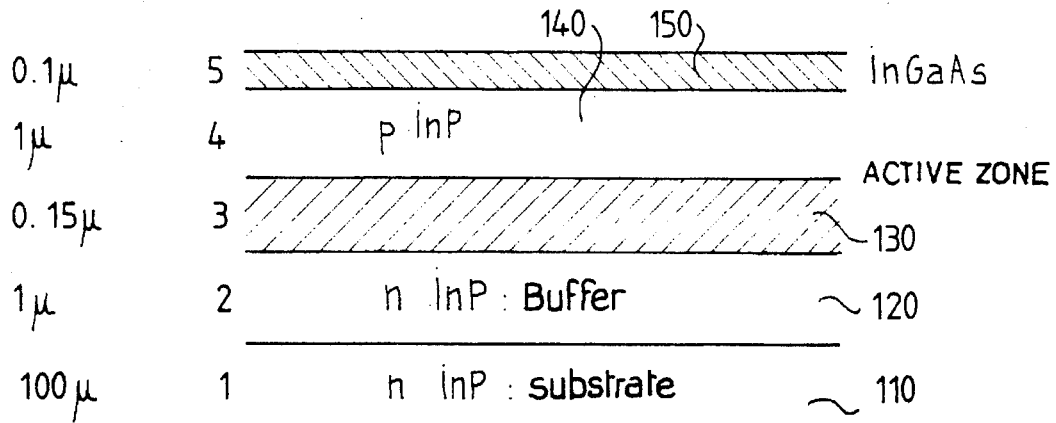
FIGS. 10 to 15 show schematic cross-sectional views of the different stages of a particular implementation of the process according to the invention.
Figure 11:
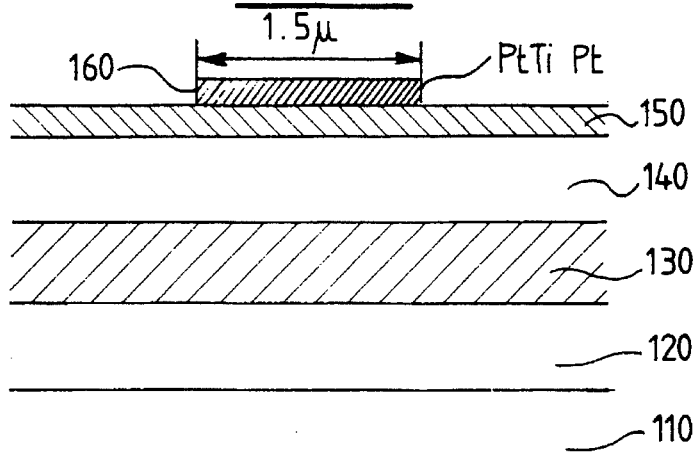

More precisely, as shown in FIG. 10, the inventors started from an $n^+$ InP substrate 110 on which they grew a first $n^+$ InP buffer layer 120, 1000 nm thick, serving as a confinement layer. Layer 120 is followed by a undoped GaInAsP quaternary layer 130 approximately 150 nm thick. This layer 130 forms the active zone and provides laser emission at a wavelength of 1550 nm. The inventors next deposited a second confinement layer 140 of p-doped InP 2000 nm thick, and lastly a ternary GaInAs layer 150, approximately 100 nm thick, which serves as the ohmic contact connection.

After epitaxy had been completed, as shown in FIG. 10, the inventors proceeded to deposit a 1500 nm-thick Ti/Pt/Ti metal strip 160 on ohmic contact layer 150. This metal strip defines the lateral dimension of the strip laser. It can be seen in FIG. 11. Strip 160 can also be produced in the form Pt/Ti/Pt.

Deposited metal strip 160 is annealed at 400° C. for two minutes. The structure was then etched by methane+hydrogen+argon reactive ionic etching (RIE: $CH_4+H_2+Ar$).

During this engraving operation, metal strip 160 serves as an etching mask.

Figure 12:
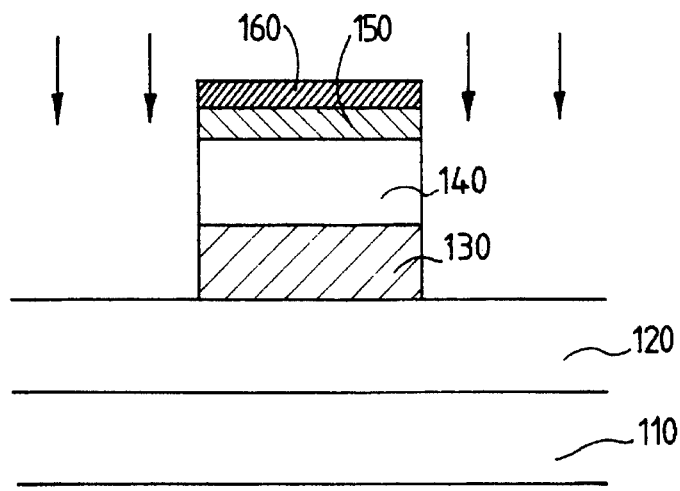

Etching is stopped at the base of active zone 130, i.e. when lower confinement layer 120 is reached as shown in FIG. 12. Depending on the case, etching can be continued beyond active zone 130 into confinement layer 120, depending on the properties of the device required.

Figure 13:
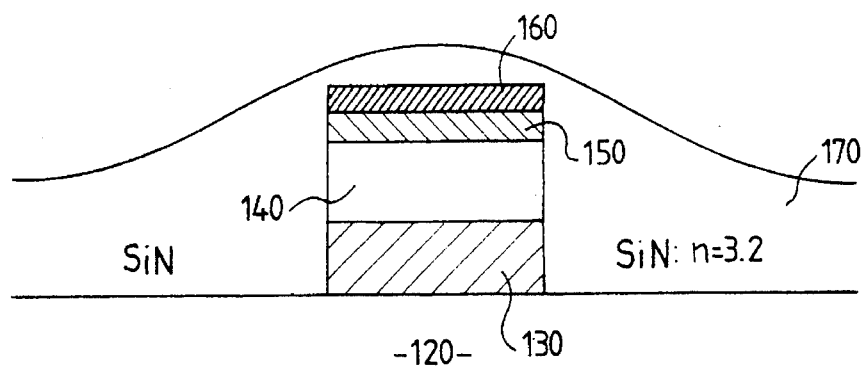

With stage 2) of the process thus terminated, the inventors then deposited a layer of SiN, approximately 1000 nm thick, by electron gun, over the entire surface of the device, including over the strip formed in the etching stage, as shown in FIG. 13.

The index of the silicon nitride thus deposited was controlled to make it equal to that of the InP forming the confinement layers, i.e. 3.2 at the working wavelength of 1550 nm.

The silicon nitride layer deposited in stage 3) can be seen in FIG. 13 under the reference 170.

Figure 14:
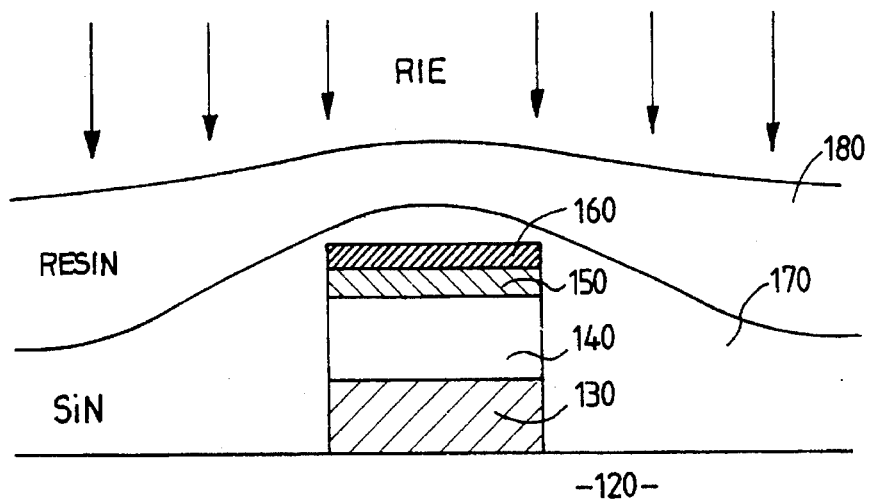

The inventors then performed a deposition of resin 180 approximately 5000 nm thick over the whole device in order to planarize the structure, as shown in FIG. 14.

The structure is next etched over all the surface, without a mask, by dry etching (RIE) as schematically shown in FIG. 14. During this etching stage, resin layer 180 protects the silicon nitride layer deposited on the outside of the strip. As can be seen in FIG. 14, resin layer 180 is thicker on the outside of the engraved strip than at the vertical of the engraved strip.

The etching performed at stage 14 was stopped when metal 160 covering the strip was reached. Note that this metal layer 160 is not etched by the RIE.

The inventors then eliminated the remaining layer of resin 180 using a chemical solvent.

The structure thus obtained comprises a visible ohmic contact metal strip 160 surrounded by silicon nitride 170 which provides optical lateral confinement thanks to its index n of 3.2 and electrical lateral confinement thanks to its high resistivity.

Figure 15:
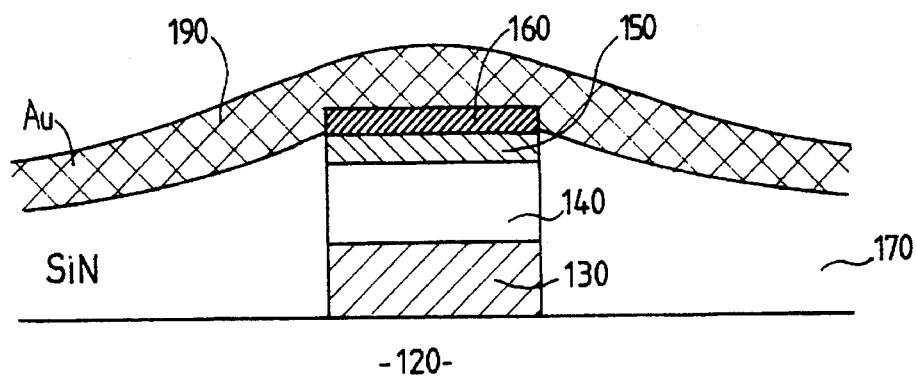
Figure 16:
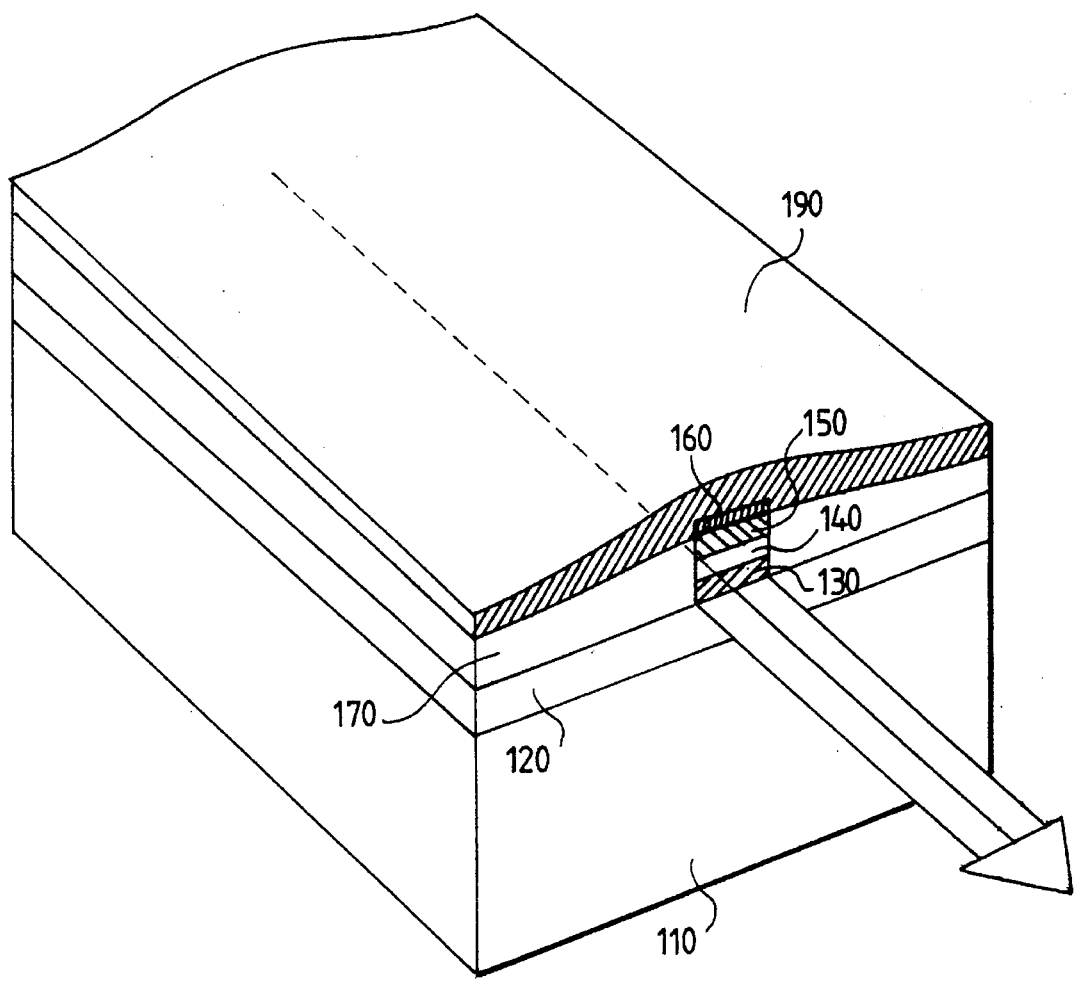
FIG. 16 shows a perspective schematic view of a laser thus obtained, and FIG. 17 schematically shows the change in the laser's output power as a function of its control current.

As shown schematically in FIG. 15, the inventors next deposited a wide, gold metal strip on metal layer 160 and the surrounding silicon nitride. The gold strip is typically 0.1 mm wide and 300 nm thick. It serves as the contact point by soldered gold wire.

Preferably, the contact on the face opposite substrate 110 is ensured by successively depositing a fine layer of AuGe or equivalent, followed by a deposit of gold or platinum thickening.

Figure 17:
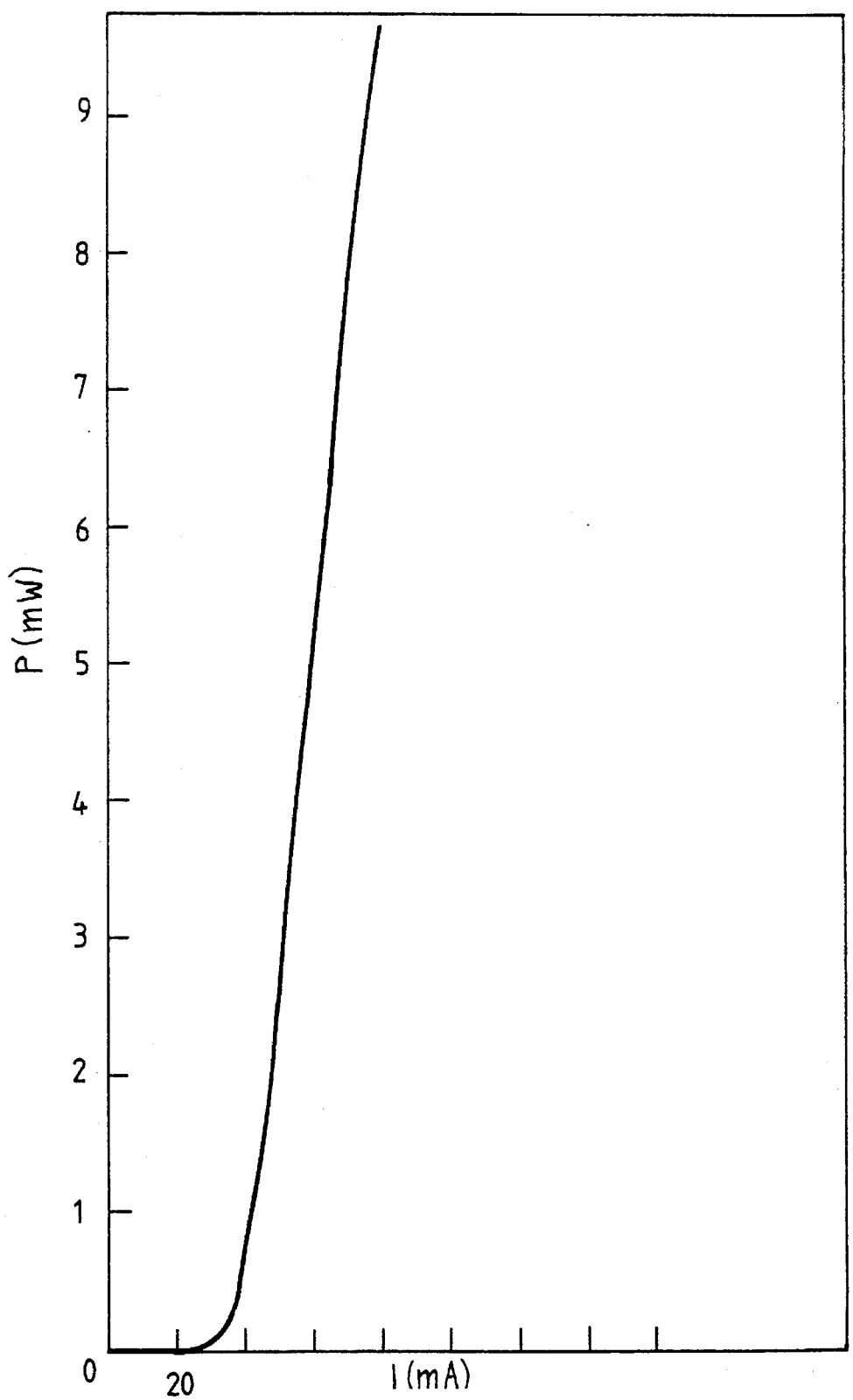

The output power of the laser structure thus formed as a function of control current is shown in attached FIG. 17.

The mean threshold current of the tested structure is approximately 50 mA per laser, and 35 mA for the best laser. The latter has an efficiency of 0.2 W/A.

The series resistance of the laser diode varies between 2 and 4 Ω for a strip length of 0.3 mm. The laser emits at a wavelength of 1500 nm.

The tests conducted on the structures fabricated by the inventors have revealed the following points:

very good stability of the laser output due notably to the good lateral optical behavior obtained by index guiding thanks to silicon nitride 170.

good electrical confinement obtained with silicon nitride 170.

reduction of stray capacitance thanks to dielectric material 170, making it possible to increase the operating frequency of fast devices.

simplicity of the selfaligned type fabrication process using a single thin mask (approximately 1500 nm).

The use of silicon nitride with index controlled by nitrogen flow rate and whose index can reproduce practically any value of III–IV materials provides good flexibility. It also makes for easy production since several depositing techniques can be used. Good control of the dimension of the optical mode can be obtained by controlling the index of the material.

Finally, the present invention makes it possible to reduce leak currents thanks to the high resistivity of silicon nitride 170.

The present invention is not of course solely limited to the particular use of silicon nitride 170, but extends, in a general way, to the use of any equivalent material.

Furthermore, the invention is not solely limited to the production of laser structures but extends to the production of any semiconductor optoelectronic device comprising a strip and requiring electrical and optical confinement, such as optical modulators and amplifiers.

We claim:

1. A laser device comprising a complete structure including a first transverse confinement layer an active layer, a second transverse confinement layer and at least one ohmic contact layer, produced by a single epitaxy, in which a strip is etched down to the base of the active layer of the device, and wherein said laser further comprises an optical lateral confinement deposit of an electrically insulating material of controlled index surrounding on each lateral side of said strip, said optical lateral confinement deposit of electrically insulating material having an optical index which is substantially equal to an index of said confinement layers so as to define an optical lateral confinement for said strip wherein the electrically insulating material of controlled index is silicon nitride.

2. A laser device comprising a complete structure including a first transverse confinement layer, an active layer, a second transverse confinement layer and at least one ohmic contact layer, produced by a single epitaxy, in which a strip is etched down to the base of the active layer of the device, and wherein said laser further comprises an optical lateral confinement deposit of an electrically insulating material of controlled index surrounding on each lateral side of said strip, said optical lateral confinement deposit of electrically insulating material having an optical index which is substantially equal to an index of said confinement layers so as to define an optical lateral confinement for said strip wherein the index of the electrically insulating material is variable over its thickness.

3. A laser device comprising a complete structure including a first transverse confinement layer, an active layer, a second transverse confinement layer and at least one ohmic contact layer, produced by a single epitaxy, in which a strip is etched down to the base of the active layer of the device, and wherein said laser further comprises an optical lateral confinement deposit of an electrically insulating material of controlled index surrounding on each lateral side of said strip, said optical lateral confinement deposit of electrically insulating material having optical index which is substantially equal to an index of said confinement layers so as to define an optical lateral confinement for said strip wherein said electrically insulating material is a layer of silicon nitride about 1000 nm thick.

4. An optoelectronic device comprising a complete structure including a first InP n+ type transverse confinement layer, a GaInAsP quaternary active layer, a second InP p type transverse confinement layer and a GaInAs ternary layer for an ohmic contact connection, produced by a single epitaxy, a strip being etched down to the base of the active layer of the device, and wherein said device further comprises an optical lateral confinement deposit of an electrically insulating silicon nitride material of controlled index having a thickness of about 1000 nm, which surrounds on each lateral side said strip, said silicon nitride deposit of electrically insulating material having an optical index which is substantially equal to an index of said confinement layers so as to define an optical lateral confinement for said strip.

5. The optoelectronic device of claim 4 wherein the optoelectronic device is a laser.

6. The device of claim 4 wherein the optical index of the electrically insulating material is constant over its thickness.

7. The device of claim 4 wherein the optical index of the electrically insulating material is variable over its thickness.

\* \* \* \* \*

UNITED STATES PATENT AND TRADEMARK OFFICE
CERTIFICATE OF CORRECTION

PATENT NO.  : 5, 511, 088
DATED       : April 23, 1996
INVENTOR(S) : Loualiche et al.

It is certified that errors appear in the above-identified patent and that said Letters Patent is hereby corrected as shown below:

In column 1 at line 45, please delete " 16 " and insert -- 16. --

In column 1 at line 47, please delete " GainAsP " and insert -- GaInAsP --

In column 2 at line 31, please delete " restatted " and insert -- restarted --.

In column 5 at line 6, please delete " GainAsP " and insert -- GaInAsP --.

In column 7 at line 10, please delete " optical " and insert -- an optical --.

In column 7 at line 17, please delete " GainAsP " and insert -- GaInAsP --.

In column 7 at line 18, please delete " GainAsP " and insert -- GaInAs --.

Signed and Sealed this

Seventh Day of January, 1997

Attest:

BRUCE LEHMAN

Attesting Officer

Commissioner of Patents and Trademarks